(12) United States Patent
Xu et al.

(10) Patent No.: US 9,386,722 B2
(45) Date of Patent: Jul. 5, 2016

(54) SERVER

(71) Applicants: Inventec (Pudong) Technology Corporation, Shanghai (CN); Inventec Corporation, Taipei (TW)

(72) Inventors: Jipeng Xu, Shanghai (CN); Jia-Bin Wang, Shanghai (CN); Hui Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 31 days.

(21) Appl. No.: 14/606,880

(22) Filed: Jan. 27, 2015

(65) Prior Publication Data

US 2016/0157378 A1 Jun. 2, 2016

(30) Foreign Application Priority Data

Nov. 27, 2014 (CN) .......................... 2014 1 0698218

(51) Int. Cl.
*G06F 1/16* (2006.01)
*H05K 7/14* (2006.01)

(52) U.S. Cl.
CPC .................................. *H05K 7/1492* (2013.01)

(58) Field of Classification Search
CPC ..... G11B 5/4826; G11B 33/124; H04M 1/15; G06F 1/1626; H05K 7/1489
USPC ............ 361/679.02, 679.33, 679.31, 679.58, 361/679.49, 679.46, 679.47, 679.37; 455/73, 575.1, 575.4; 312/223.2, 222, 312/139, 408; 248/122.1, 126, 276.1, 562; 16/239, 249

See application file for complete search history.

(56) References Cited

U.S. PATENT DOCUMENTS

| 2007/0263325 | A1* | 11/2007 | Hanya | G11B 5/4826 360/245.3 |
| 2012/0074006 | A1* | 3/2012 | Monaco | H04M 1/15 206/320 |
| 2015/0342080 | A1* | 11/2015 | Chen | H05K 7/1489 361/679.31 |
| 2015/0382499 | A1* | 12/2015 | Chiasson | G11B 33/124 361/679.33 |

* cited by examiner

*Primary Examiner* — Hung Duong

(74) *Attorney, Agent, or Firm* — Muncy, Geissler, Olds & Lowe, P.C.

(57) ABSTRACT

A server includes a mid-plane board, a storage backplane module, a plurality of first storage units, a vertical interposer board, a first electronic module, a second electronic module and a plurality of power supply units. The vertical interposer board is vertically inserted and thus electrically coupled to the mid-plane board. The storage backplane module, the vertical interposer board, the first electronic module, the second electronic module and the power supply units are electrically connected to each other through the mid-plane board.

11 Claims, 6 Drawing Sheets

SERVER

BACKGROUND OF INVENTION

1. Field of the Invention

The invention relates to a server, and more particularly to the server that introduces a vertical interposer board to perform 3D extension of the server.

2. Description of the Prior Art

Recently, for blooming of the network industry, a demand for upgrading the servers that provide network service is obvious. Through the performance boosting in the capacity of the server, the uprising operational requirement for networking can thus be met.

In the art of the server, major efforts are devoted to enhancing the performance of the board/cartridge and the accessing speed (both in read and write) as well as the operational stability of the hard disk drive (HDD). Hence, more and more electronic devices are required to be implemented. However, in the circumstance of the limited space inside the server, addition of other electronic devices into the server is not as easy as expected. Definitely, the topic of how to implementing additional electronic devices to the server becomes one of crucial issues in the art.

SUMMARY OF THE INVENTION

Hence, in the art, in order to enable the server to meet the network requirements in mass data management and the processing speed, the conventional technology is generally resorted to increase the access speed and stability of the hard disk. Yet, the resulted improvement thereby is limited and usually can't meet the need. Therefore, for effectively resolving the aforesaid situations, plenty of functional boards or the like electronic devices are needed to be implemented into the server. Sadly, in the art, the space inside a typical server is too small to allow sufficient extensions, and thus satisfied contribution for the server extension can't be possible.

Accordingly, it is the primary object of the present invention to provide a server that introduces a vertical interposer board to electrically couple the first electronic module and the second electronic module so as to achieve an effective extension.

In the present invention, the server includes a chassis, a mid-plane board, a storage backplane module, a plurality of first storage units, a vertical interposer board, a first electronic module, a second electronic module and a plurality of power supply units.

The chassis has a front side, a rear side and a bottom portion connecting the front side and the rear side. The mid-plane board is located at bottom portion between the front side and the rear side. The mid-plane board is coupled to the storage backplane module, which is mounted horizontally above the bottom portion and located at the front side. A plurality of first storage units is inserted downward to the bottom portion of the chassis and is connected to the storage backplane module. The vertical interposer board is vertically inserted and thus electrically coupled to the mid-plane board.

The first electronic module includes a first extension board and a first main mother board. The first extension board is vertically inserted and thus electrically coupled to the vertical interposer board. The first main mother board located aside the first extension board is electrically coupled to the first extension board by parallel to the mid-plane board. The second electronic module has a second extension board vertically inserted and thus electrically coupled to the vertical interposer board, and the second extension board extends toward the rear side by parallel to both the mid-plane board and the first electronic module. A plurality of power supply units is mounted horizontally above the bottom portion, located at the rear side, inserted and thus electrically coupled to the mid-plane board.

In the present invention, the storage backplane module, the vertical interposer board, the first electronic module, the second electronic module and the power supply units are electrically coupled together via the mid-plane board.

In one embodiment of the present invention, the second electronic module further includes a second main mother board located aside the second extension board by parallel to the mid-plane board and electrically coupled to the second extension board.

In one embodiment of the present invention, the first electronic module further includes a first storage back plate for at least one second storage unit to electrically couple the first main mother board.

In one embodiment of the present invention, the second electronic module further includes a second storage back plate and a plurality of first storage units. The second storage back plate is electrically coupled to the second extension board. The first storage units are electrically coupled to the second storage back plate. Thereby, the second storage back plate can be electrically coupled to the second extension board.

In one embodiment of the present invention, the storage backplane module and the mid-plane board are electrically coupled through at least one bridge plate.

In one embodiment of the present invention, the server further includes a fixation structure for fixing the vertical interposer board to the chassis. Preferably, the server further includes a supportive structure fixed to both lateral sides of the chassis in a cross manner and contacting the fixation structure.

In one embodiment of the present invention, the server can further include a fan-mounting structure located above the mid-plane board and fixed to both lateral sides of the chassis in a cross manner. The fan-mounting structure is located in mid of the first storage units, the first electronic module and the second electronic module.

In one embodiment of the present invention, the first extension board further includes a first main extension board and a first auxiliary extension board, in which the first main extension board and the first auxiliary extension board are individual inserted to the vertical interposer board.

In one embodiment of the present invention, the server further includes two magnetic cluster control plates mounted respectively to both sides of the power supply units and electrically coupled to the mid-plane board.

All these objects are achieved by the server described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a server. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
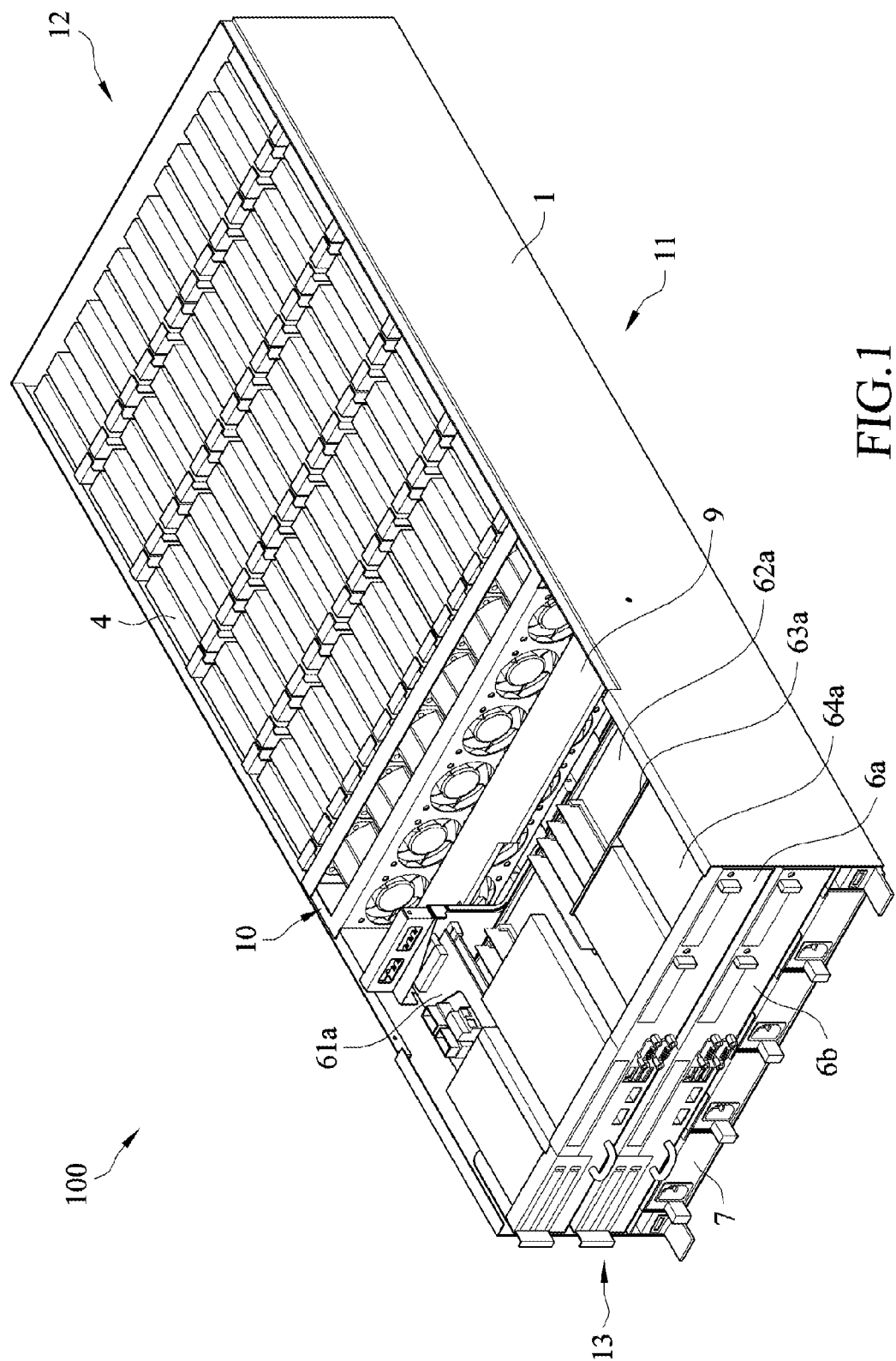
FIG. 1 is a schematic perspective view of a preferred embodiment of the server in accordance with the present invention.
Figure 2:
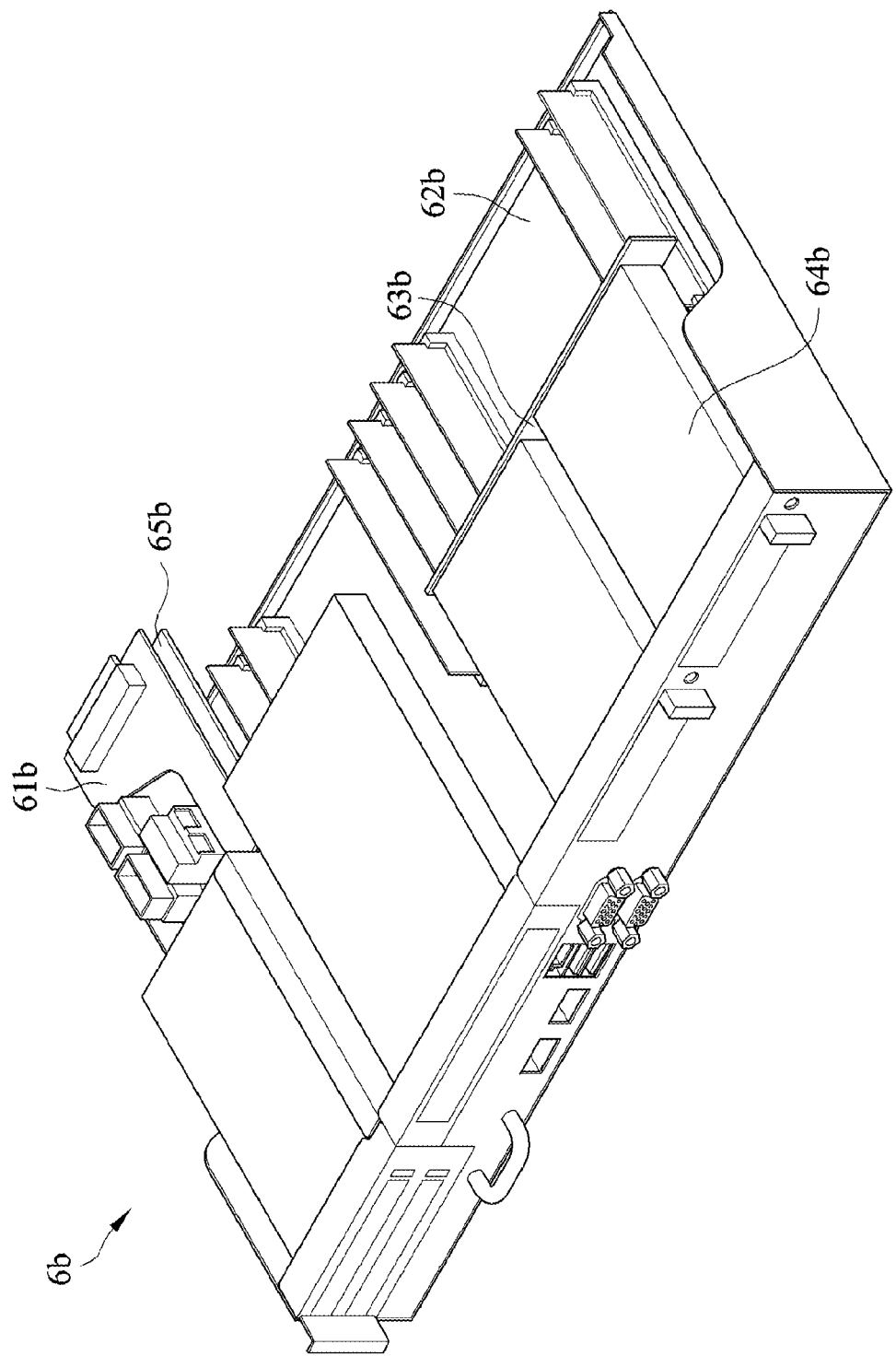
FIG. 2 is a schematic perspective view of the second electronic module of FIG. 1.
Figure 3:
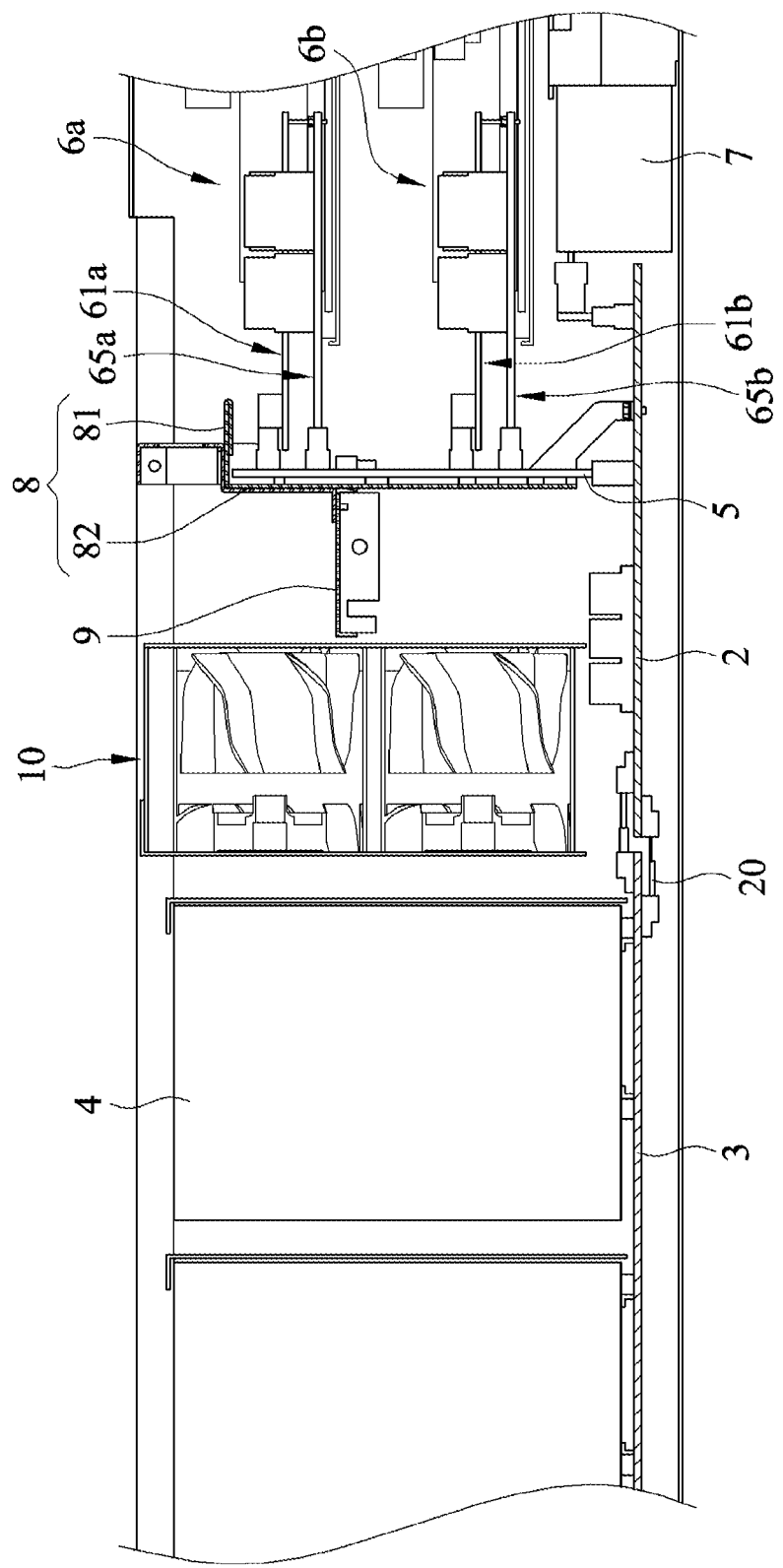
FIG. 3 is a schematic planar view of part of the server of FIG. 1.
Figure 4:
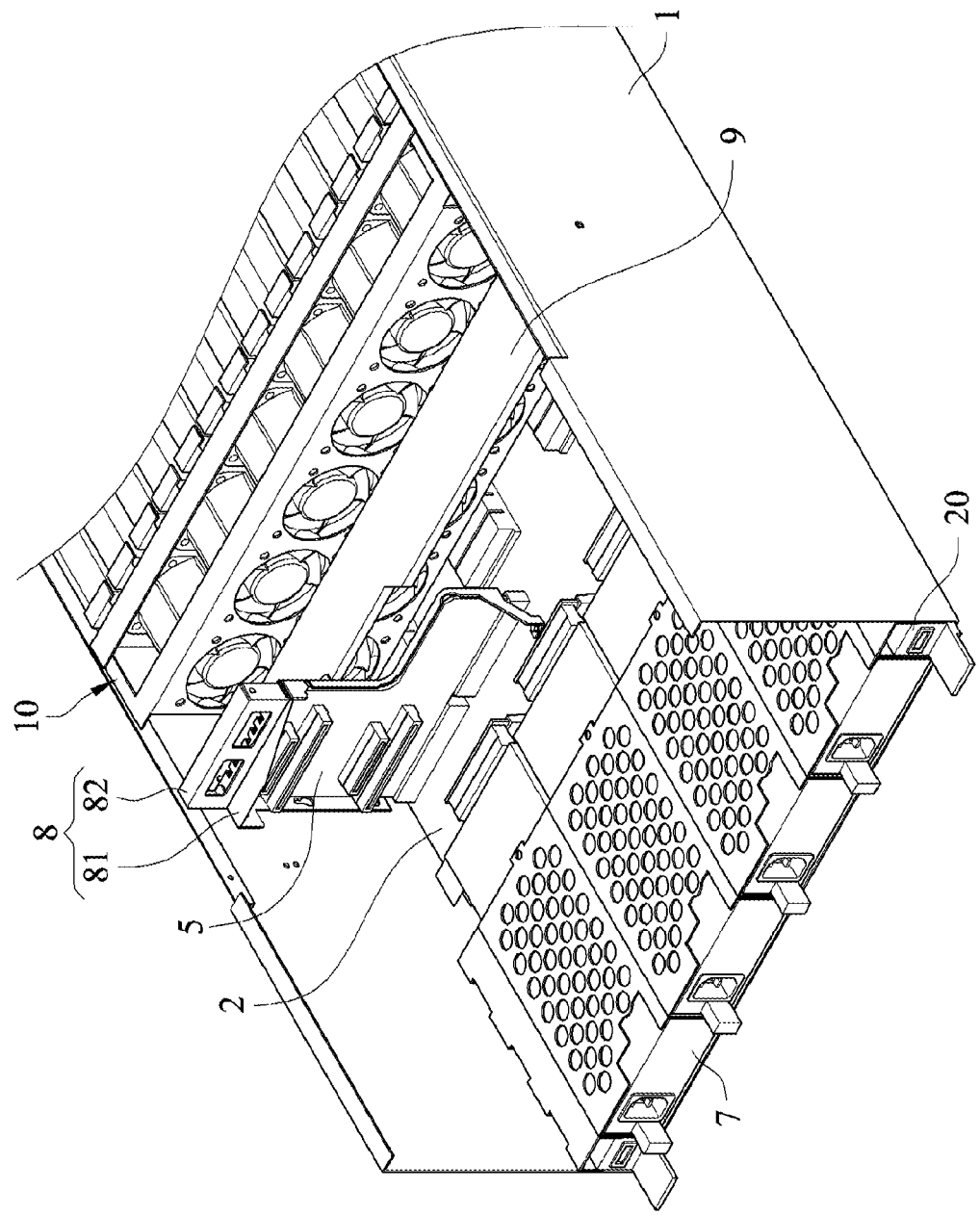
FIG. 4 is a schematic perspective view showing the vertical interposer board fixed in the chassis of the server of FIG. 1.
Figure 5:
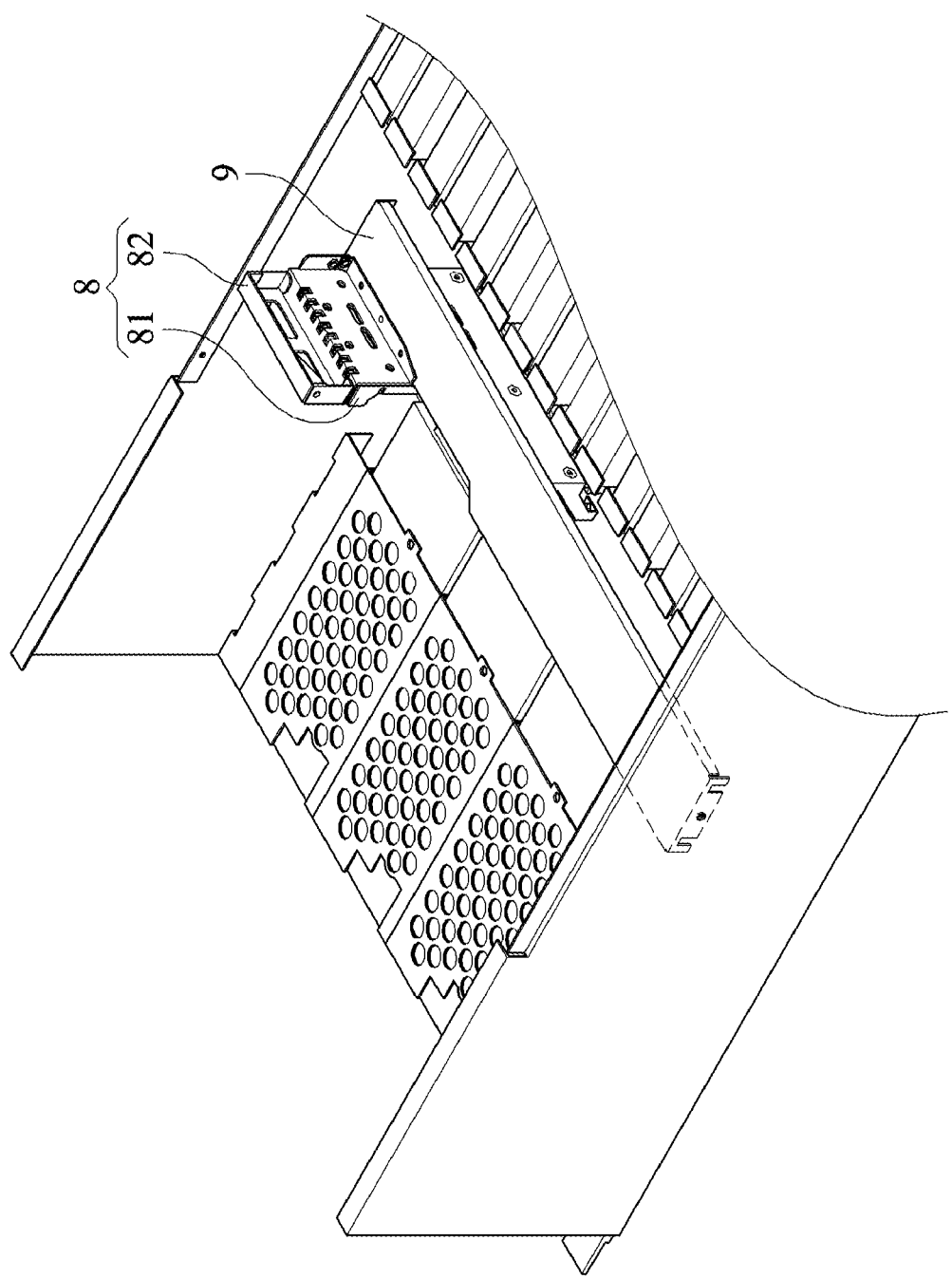
FIG. 5 is a schematic perspective view showing the supportive structure contacting the fixation structure of the server of FIG. 1.

Refer now to FIG. 1 through FIG. 5, in which FIG. 1 is a schematic perspective view of a preferred embodiment of the server in accordance with the present invention, FIG. 2 is a schematic perspective view of the second electronic module of FIG. 1, FIG. 3 is a schematic planar view of part of the server of FIG. 1, FIG. 4 is a schematic perspective view showing the vertical interposer board fixed in the chassis of the server of FIG. 1, and FIG. 5 is a schematic perspective view showing the supportive structure contacting the fixation structure of the server of FIG. 1. As shown, the server 100 includes a chassis 1, a mid-plane board 2, seven storage backplane modules 3 (one labeled in the figure), a plurality of first storage units 4, a vertical interposer board 5, a first electronic module 6a, a second electronic module 6b, four power supply units 7, a fixation structure 8, a supportive structure 9 and a fan-mounting structure 10.

The chassis 1 has a bottom portion 11, a front side 12 and a rear side 13, in which the front side 12 and the rear side 13 are located to opposing ends of the bottom portion 11.

The mid-plane board 2 is mounted horizontally above the bottom portion 11 and located between the front side 12 and the rear side 13 inside the chassis 1.

The storage backplane module 3 is individually mounted also horizontally above the bottom portion 11 by closing to the front side 12. The storage backplane module 3 uses two bridge plates 20 (one labeled in the figure) to electrically couple the mid-plane board 2. In this embodiment, each of the storage backplane module 3 and the mid-plane board 2 includes connection ports at both sides thereof so as to allow the two bridge plates 20 to electrically couple to both sides of each of the storage backplane module and mid-plane board 2.

Each of the first storage units 4 is inserted downward to the bottom portion 11 of the chassis 1 so as to electrically couple the respective storage backplane module 3. In the present invention, the first storage unit 4 can be a hard disk. In this embodiment, 70 first storage units 4 can be included, and each individual storage backplane module 3 is to receive thereupon 10 of the first storage units 4.

The vertical interposer board 5 is vertically inserted and thus electrically coupled to the mid-plane board 2.

The first electronic module 6a includes a first main extension board 61a, a first main mother board 62a, a first storage back plate 63a, two second storage units 64a and a first auxiliary extension board 65a. The first main extension board 61a is vertically inserted and thus electrically coupled to the respective vertical interposer board 5, and extends toward the rear side 13 by parallel to the mid-plane board 2. The first main mother board 62a is mounted aside the first main extension board 61a and electrically coupled with the first main extension board 61a. The first main mother board 62a and the mid-plane board 2 are substantially parallel to each other. The first storage back plate 63a is electrically coupled to the first main mother board 62a, and the second storage unit 64a is electrically coupled to the first storage back plate 63a, such that the first storage back plate 63a can electrically couple the first main mother board 62a. In the present invention, the first storage back plate 63a can be a storage back plate for 2.5-in hard disks, and the second storage unit 64a can be a hard disk, preferably a 2.5-in hard disk.

The first auxiliary extension board 65a is vertically inserted and thus electrically coupled to the vertical interposer board 5, and extends toward the rear side 13 by parallel to the mid-plane board 2 and the first main extension board 61a. The first auxiliary extension board 65a and the first main extension board 61a are both electrically coupled to the first main mother board 62a or the extension card at the first main mother board 62a.

The second electronic module 6b includes a second main extension board 61b, a second main mother board 62b, a first storage back plate 63b, two second storage units 64b and a second auxiliary extension board 65b. The second main extension board 61b is vertically inserted and thus electrically coupled to the vertical interposer board 5, and extends toward the rear side 13 by parallel to both the mid-plane board 2 and the first electronic module 6a. The second main mother board 62b is mounted aside the second main extension board 61b and electrically coupled with the second main extension board 61b. The second main mother board 62b is extended by parallel to the mid-plane board 2. The first storage back plate 63b is electrically coupled to the first main mother board 62b, and the second storage unit 64b is electrically coupled to the first storage back plate 63b, such that the first storage back plate 63 can electrically couple the first main mother board 62b. In the present invention, the first storage back plate 63b, by similar to the first storage back plate 63a, can be a storage back plate for 2.5-in hard disks, and the second storage unit 64b can be a hard disk, preferably a 2.5-in hard disk.

The first auxiliary extension board 65b is vertically inserted and thus electrically coupled to the vertical interposer board 5, and extends toward the rear side 13 by parallel to both the mid-plane board 2 and the first main extension board 61b. The first auxiliary extension board 65b and the first main extension board 61b are electrically coupled to the first main mother board 62b or the associated extension cards.

As state above, in this embodiment, the first electronic module 6d above and the second electronic module 6b are both main boards, the first main mother board 62a and the second main mother board 62b. However, in some other embodiments, one of the first electronic module 6a and the second electronic module 6b is a main board.

The four power supply units 7 are mounted horizontally above the bottom portion 11 at the rear side 13 and electrically coupled to the mid-plane board 2. In addition, in some other embodiments, the power supply units 7 can be inserted back to the power supply back plate and then thereby electrically coupled to the mid-plane board 2.

In the present invention, the electric connection among the storage backplane module 3, the vertical interposer board 5, the first electronic module 6a, the second electronic module 6b and the power supply units 7 are established through the mid-plane board 2, such that the power, the information and the control signals can effectively communicated.

The fixation structure 8 is fixed at the bottom portion 11 and the corresponding lateral side of the chassis 1. The vertical interposer board 5 is fixed to the fixation structure 8 so as to further fix the vertical interposer board 5 to the chassis 1 through the fixation structure 8.

The supportive structure 9 fixed to the chassis 1 in a cross manner contacts at the fixation structure 8 so as to avoid an accidental drop of the vertical interposer board 5 while mounting or replacing the first electronic module 6a and the second electronic module 6b.

The fan-mounting structure 10 is mounted above the mid-plane board 2 by being fixed to both sides of the chassis 1 in a cross manner. The fan-mounting structure 10 is located in mid of the first storage units 4, the first electronic module 6a and the second electronic module 6b so as to allow the forcing flow from the fan devices able to flow therethrough to further reach the mid-plane board 2, the first storage units 4, the first electronic module 6a and the second electronic module 6b for heat dissipation.

In addition, the server 100 of the present invention can further include two magnetic cluster control plates 30 located to two opposing sides of the power supply units 7 and electrically coupled to the mid-plane board 2. The magnetic cluster control plate 30 are to couple at least two servers or to provide extension to the foreign facilities.

Figure 6:
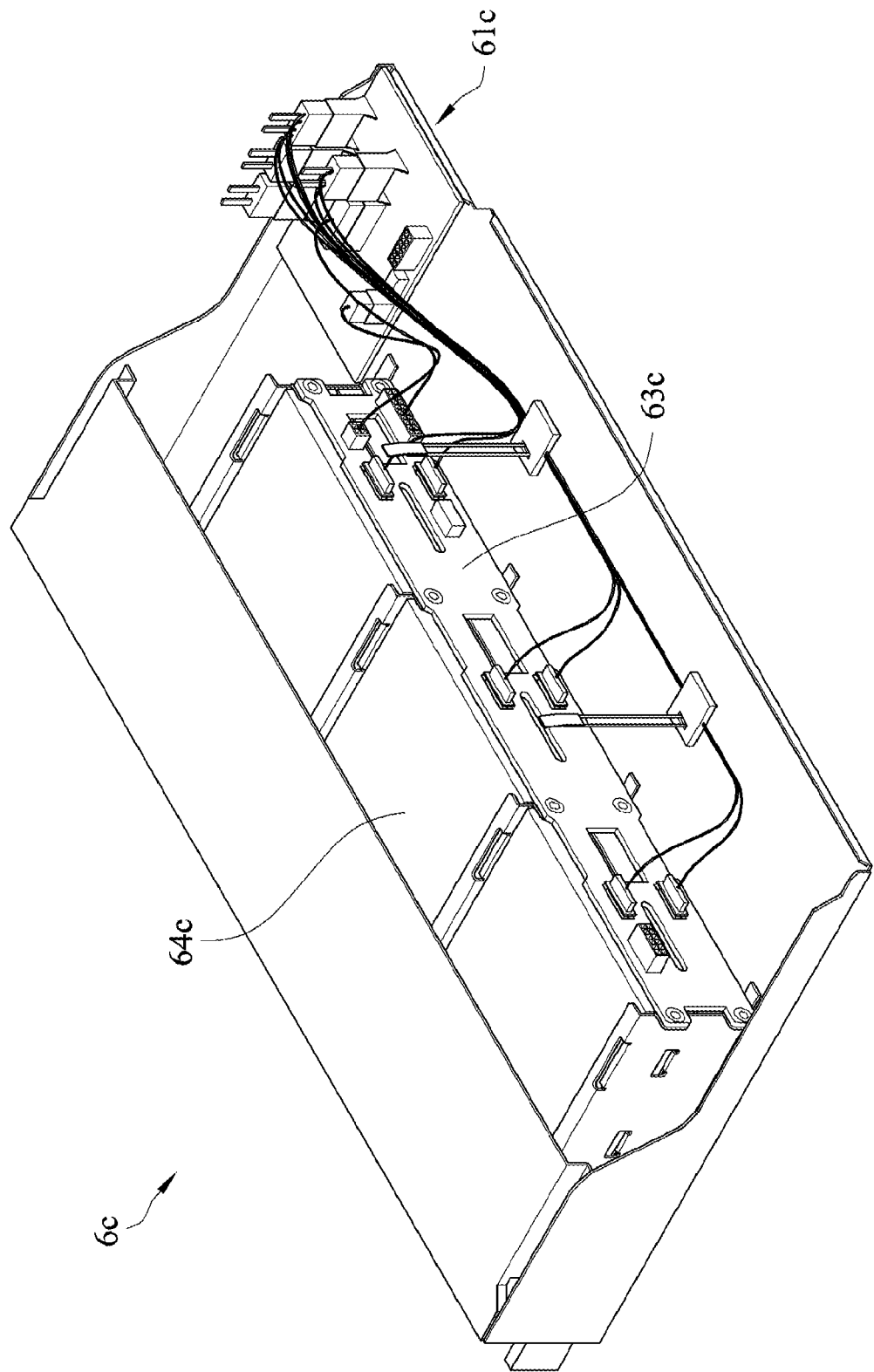
FIG. 6 is a schematic perspective view of a second electronic module of another embodiment of the server in accordance with the present invention.

Refer now to FIG. 1, FIG. 2, FIG. 3 and FIG. 6, in which FIG. 6 is a schematic perspective view of a second electronic module of another embodiment of the server in accordance with the present invention. As shown, a second electronic module 6c includes a second extension board 61c, a second storage back plate 63c and six first storage units 64c. The second electronic module 6c is there for storage extension to replace the aforesaid second electronic module 6b in the server 100.

In the case that the second electronic module 6c is to replace the aforesaid second electronic module 6b in the server 100, the second extension board 61c is vertically inserted and thus electrically coupled to the vertical interposer board 5, and extends toward the rear side 13 by parallel to both the mid-plane board 2 and the first electronic module 6a. The second storage back plate 63c is electrically coupled to the second extension board 61c, and the first storage units 64c are electrically coupled to the second storage back plate 63c, such that the second storage back plate 63c can be electrically coupled to the second extension board 61c. In the present invention, the second storage back plate 63c can be the storage back plate for installing 3.5-in hard disks, and the first storage units 64c can be a hard disk, preferably a 3.5-in hard disk.

In summary, the server of the present invention introduces the vertical interposer board to connect the first electronic module and the second electronic module, so that the extension of the server can be possible and also the stability thereof can be enhanced. Further, for the first electronic module and the second electronic module are inserted onto the vertical interposer board, so the first electronic module and the second electronic module can be mounted at the mid-plane board in a parallel manner, and thus the limited room in the server can be effectively utilized.

While the present invention has been particularly shown and described with reference to a preferred embodiment, it will be understood by those skilled in the art that various changes in form and detail may be without departing from the spirit and scope of the present invention.

What is claimed is:

1. A server, comprising:
   a chassis, having a bottom portion, a front side and a rear side, wherein the front side and the rear side are disposed individual at opposing ends of the bottom portion;
   a mid-plane board, mounted at the bottom portion between the front side and the rear side;
   a storage backplane module, mounted horizontally above the bottom portion by closing to the front side, electrically coupled with the mid-plane board;
   a plurality of first storage units, inserted downward and toward the bottom portion to the storage backplane module;
   a vertical interposer board, vertically inserted and thus electrically coupled to the mid-plane board;
   a first electronic module, including a first extension board and a first main mother board, the first extension board being vertically inserted and thus electrically coupled to the vertical interposer board, the first main mother board being disposed aside and also electrically coupled to the first extension board, the first main mother board being parallel to the mid-plane board;
   a second electronic module, having a second extension board, the second extension board being vertically inserted and thus electrically coupled to the vertical interposer board and also extending toward the rear side by parallel to the mid-plane board and the first electronic module; and
   a plurality of power supply units, mounted horizontally at the rear side above the bottom portion, inserted and thus electrically coupled to the mid-plane board;
   wherein the storage backplane module, the vertical interposer board, the first electronic module, the second electronic module and the power supply units are all electrically coupled with the mid-plane board.

2. The server of claim 1, wherein the second electronic module further includes a second main mother board located aside the second extension board by parallel to the mid-plane board and electrically coupled to the second extension board.

3. The server of claim 1, wherein the first electronic module further includes a first storage back plate and at least one second storage unit electrically coupled to the first main mother board via the first storage back plate.

4. The server of claim 1, wherein the second electronic module further includes a second storage back plate and a plurality of first storage units, the second storage back plate being electrically coupled to the second extension board, the first storage units being electrically coupled to the second storage back plate and further to the second extension board.

5. The server of claim 1, wherein the storage backplane module and the mid-plane board are electrically coupled through at least one bridge plate.

6. The server of claim 1, further including a fixation structure for fixing the vertical interposer board to the chassis.

7. The server of claim 6, further including a supportive structure fixed to both lateral sides of the chassis in a cross manner and contacting with the fixation structure.

8. The server of claim 1, further including a fan-mounting structure located above the mid-plane board, fixed to both lateral sides of the chassis in a cross manner, and positioned in mid of the first storage units, the first electronic module and the second electronic module.

9. The server of claim 1, wherein the first extension board further includes a first main extension board and a first auxiliary extension board, the first main extension board and the first auxiliary extension board being inserted individual to the vertical interposer board.

10. The server of claim 1, further including two magnetic cluster control plates located to both sides of the plurality of the power supply units and electrically coupled to the mid-plane board.

11. The server of claim 1, wherein the second electronic module is located in mid of the first electronic module and the power supply units.

\* \* \* \* \*